(12) United States Patent
Ueda et al.

(10) Patent No.: US 8,647,807 B2
(45) Date of Patent: Feb. 11, 2014

(54) PHOTOSENSITIVE RESIN COMPOSITION, PHOTOSENSITIVE DRY FILM AND METHOD FOR FORMING PATTERN

(75) Inventors: Akifumi Ueda, Toyohashi (JP); Hidetaka Nakagawara, Toyohashi (JP); Kazuo Watanabe, Koshigaya (JP); Shigeki Watanabe, Koshigaya (JP); Wei Jen Lan, Taoyuan Hsien (TW); Chao Wen Lin, Taoyuan Hsien (TW)

(73) Assignees: Micro Process Inc., Koshigaya-shi (JP); Everlight Chemical Industrial Corporation, Taoyuan Hsien (TW); Mitsubishi Rayon Co., Ltd., Tokyo (JP)

( * ) Notice: Subject to any disclaimer, the term of this patent is extended or adjusted under 35 U.S.C. 154(b) by 0 days.

(21) Appl. No.: 13/519,495

(22) PCT Filed: Dec. 27, 2010

(86) PCT No.: PCT/JP2010/073532
§ 371 (c)(1),
(2), (4) Date: Aug. 22, 2012

(87) PCT Pub. No.: WO2011/081131
PCT Pub. Date: Jul. 7, 2011

(65) Prior Publication Data
US 2013/0004895 A1    Jan. 3, 2013

(30) Foreign Application Priority Data
Dec. 28, 2009   (JP) .................................. 2009-297144

(51) Int. Cl.
*G03F 7/023*   (2006.01)
*G03F 7/30*    (2006.01)

(52) U.S. Cl.
CPC ................... *G03F 7/0233* (2013.01); *G03F 7/30* (2013.01)
USPC ............ 430/191; 430/192; 430/193; 430/326

(58) Field of Classification Search
CPC ................. G03F 7/0233; G03F 7/30
USPC ................. 430/191, 192, 193, 326
See application file for complete search history.

(56) References Cited

U.S. PATENT DOCUMENTS 4,950,582 A * 8/1990 Aoai et al. ..................... 430/175
5,338,643 A * 8/1994 Kanazawa et al. ............ 430/190
5,624,781 A    4/1997 Naruse et al.

FOREIGN PATENT DOCUMENTS

| CN | 1768302 A | 5/2006 |
|---|---|---|
| CN | 101121762 A | 2/2008 |
| CN | 101182366 A | 5/2008 |
| JP | 1 280748 | 11/1989 |
| JP | 5 107756 | 4/1993 |
| JP | 5 107757 | 4/1993 |
| JP | 5 224407 | 9/1993 |
| JP | 6-167811 A | 6/1994 |
| JP | 7 133449 | 5/1995 |
| JP | 2003 156843 | 5/2003 |
| JP | 2003 287905 | 10/2003 |
| JP | 2009 282512 | 12/2009 |
| KR | 10-0913058 B1 | 8/2009 |

OTHER PUBLICATIONS

Combined Chinese Office Action and Search Report issued Jul. 2, 2013, in Chinese Patent Application No. 201080061283.0 with partial English translation.
Combined Chinese Office Action and Search Report issued Aug. 2, 2013, in Chinese Patent Application No. 201080064710.0 with partial English translation.
International Search Report issued Jan. 25, 2011 in PCT/JP2010/073532 Filed Dec. 27, 2010.
International Search Report issued Jan. 25, 2011, in PCT/JP2010/073525.
U.S. Appl. No. 13/519,418, filed Aug. 9, 2012, Ueda, et al.

* cited by examiner

*Primary Examiner* — John Chu
(74) *Attorney, Agent, or Firm* — Oblon, Spivak, McClelland, Maier & Neustadt, L.L.P.

(57) ABSTRACT

A photosensitive resin composition comprising: a vinyl-based polymer (I) obtained by polymerizing a monomer mixture containing a monomer (a) having a phenolic hydroxyl group; a vinyl-based polymer (II) obtained by polymerizing a monomer mixture containing a carboxyl group-containing vinyl monomer (b), and having a weight average molecular weight of 20,000 to 100,000, provided that the vinyl-based polymer (I) is excluded; a quinonediazide compound (III); and a compound (IV) represented by following formula (5). [In the formula, Y is a hydrocarbon group of 1 to 6 carbon atoms; l and m are each independently an integer of 1 to 3; n is 1 or 2; p and q are each independently 0 or 1.].

[Chemical Formula I]

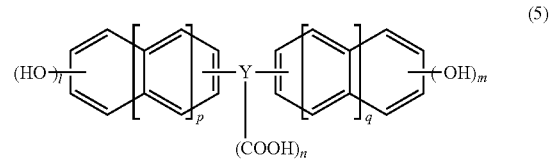

10 Claims, No Drawings

PHOTOSENSITIVE RESIN COMPOSITION, PHOTOSENSITIVE DRY FILM AND METHOD FOR FORMING PATTERN

TECHNICAL FIELD

The present invention relates to a photosensitive resin composition, a photosensitive dry film, and a method for forming patterns using the same.

Priority is claimed on Japanese Patent Application No. 2009-297144, filed Dec. 28, 2009, the content of which is incorporated herein by reference.

BACKGROUND ART

As a process of forming an electronic circuit, a process using a photosensitive resin composition is generally employed.

In the process of forming a circuit using a photosensitive resin composition, through a step of forming a resist film composed of a photosensitive resin composition on the surface of the substrate, a step of irradiating the light to the resist film through a mask to form a latent image, a step of developing the resist film in which a latent image was formed, using a developing solution to form a resist pattern, and a step of chemically etching and plating a part where the resist is not presented, then the electronic circuit is formed.

In addition, in the chip-on-film (COF) in which a bare chip was directly arranged on the flexible substrate and the multilayer printed wiring board obtained by the build-up method, the miniaturization of electronic circuits has been investigated. In the circuit formation process for the COF and the multilayer printed wiring board obtained by the build-up method, at the step corresponding to the normal development step in the printed wiring board, 1% by weight aqueous solution of sodium carbonate is used as a developing solution.

As the conventional photosensitive resin composition, the following is known.

(1) Photosensitive resin composition containing a compound consisting of a novolac resin, a quinonediazide compound, cyclohexanes, and phenols (Patent Document 1).

(2) Photosensitive resin composition containing a vinyl-based polymer having a structural unit derived from a monomer having a phenolic hydroxyl group and a structural unit derived from a vinyl-based monomer containing a carboxyl group, and a quinonediazide compound (Patent Document 2).

(3) Photosensitive resin composition containing a vinyl-based copolymer having a structural unit derived from a vinyl-based monomer containing a carboxyl group, a quinonediazide compound, and a polyhydric phenol compound (Patent Document 3).

However, a novolac resin contained in the photosensitive resin composition of (1) is a brittle resin, and if the photosensitive resin composition containing a novolac resin is used as a resist film, there is a problem that cracks are likely to occur onto the resist film. In particular, if the photosensitive resin composition is made into a dry film, because the dry film is wound, the aforementioned problem becomes noticeable.

In addition, because the solubility of the photosensitive resin composition (2) in an aqueous solution of sodium carbonate is bad, when the photosensitive resin composition (2) is used in circuit formation process in the COF and the multilayer printed wiring board obtained by the build-up method, the resolution is likely to be insufficient. Further, if the monomer component having a phenolic hydroxyl group is polymerized, the resulting vinyl-based polymer has a relatively low molecular weight. Therefore, making a vinyl-based polymer with a high molecular weight is difficult. For this reason, plating resistance of the resist film becomes insufficient.

In addition, in the photosensitive resin composition of (3), because the vinyl-based copolymer does not have a phenolic hydroxyl group, there is no interaction between the phenolic hydroxyl group and a quinonediazide. Therefore, the unexposed area of the resist film is easily dissolved, and is likely to occur the film reduction.

From the background described above, in the circuit formation process in the COF and the multilayer printed wiring board obtained by the build-up method, a photosensitive resin composition which can form a resist film in which the occurrence of cracks is suppressed, the film reduction of an unexposed area is suppressed, sensitivity and resolution are excellent, and the plating resistance is superior.

CITATION LIST

Patent Documents

[Patent Document 1] Japanese Unexamined Patent Application, First Publication No. Hei 5-224407
[Patent Document 2] Japanese Unexamined Patent Application, First Publication No. 2003-287905
[Patent Document 3] Japanese Unexamined Patent Application, First Publication No. 2003-156843

SUMMARY OF THE INVENTION

Technical Problem

In the process of circuit formation in the COF and the multilayer printed wiring board obtained by build-up method, the present invention provides a photosensitive resist composition which can form a resist film in which the occurrence of cracks is suppressed, the film reduction of an unexposed area is suppressed, sensitivity and resolution are excellent, and the plating resistance is superior, and provides a photosensitive dry film, and a method for forming a pattern using the same.

Solution to Problem

First embodiment of the present invention is a photosensitive resin composition comprising: a vinyl-based copolymer (I) obtained by polymerizing a monomer mixture containing a monomer (a) having a phenolic hydroxyl group, a vinyl-based polymer (II) obtained by polymerizing a monomer mixture containing a carboxyl group-containing vinyl monomer (b), and having a weight average molecular weight of 20,000 to 100,000, provided that the vinyl-based polymer (I) is excluded; a quinonediazide compound (II); and a compound (IV) represented by the following formula (5).

[Chemical Formula 1]

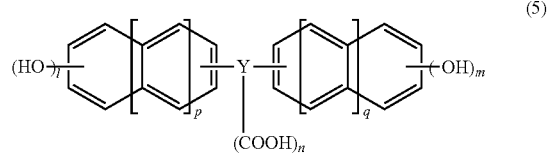

(5)

[In the formula, Y is a hydrocarbon group of 1 to 6 carbon atoms; l and m are each independently an integer of 1 to 3; n is 1 or 2; p and q are each independently 0 or 1.]

In addition, with respect to the compound (IV), a compound represented by the following formula (5-1) or the following formula (5-2) is preferable.

[Chemical Formula 2]

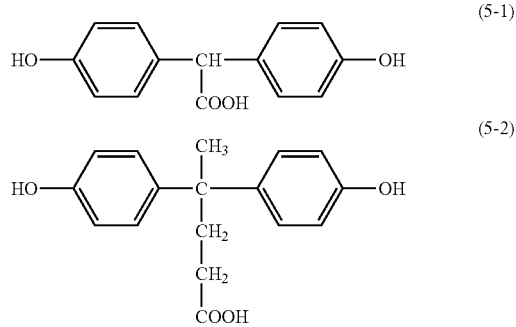

(5-1)

(5-2)

With respect to the vinyl-based polymer (I), a polymer obtained by polymerizing a monomer mixture further containing a carboxyl group-containing vinyl monomer (b) is preferable.

If the vinyl-based polymer (I) is a polymer obtained by polymerizing a monomer mixture containing the monomer (a), the amount of the monomer (a) is preferably 5 to 100 mol %, relative to the total amount of crude monomers as high as 100 mol %.

If the vinyl-based polymer (I) is a polymer obtained by polymerizing a monomer mixture containing the monomer (a) and the monomer (b), the amount of the monomer (b) is preferably 5 to 30 mol %, relative to the total amount of crude monomers as high as 100 mol %.

If the vinyl-based polymer (II) is a polymer obtained by polymerizing a monomer mixture containing the monomer (b), the amount of the monomer (b) is preferably 5 to 50 mol %, relative to the total amount of crude monomers as high as 100 mol %.

Second embodiment of the present invention relates to a photosensitive dry film composed from the aforementioned photosensitive resin composition on the surface of the support film.

Third embodiment of the present invention is a method for forming a pattern including: forming a resist film composed of the aforementioned photosensitive resin composition on the surface of the substrate; conducting exposure of the resist film to form a latent image; and developing the resist film in which the latent image is formed, using a developing solution having a pH of 10.5 to 12.5 to form a resist pattern.

Advantageous Effects of Invention

According to the photosensitive resin composition of the present invention, in the circuit formation process in the COF and the multilayer printed wiring board obtained by the build-up method, it is possible to form a resist film in which the occurrence of cracks is suppressed, the film reduction of an unexposed area is suppressed, sensitivity and resolution are excellent, and the plating resistance is superior.

According to the photosensitive dry film of the present invention, in the circuit formation process in the COF and the multilayer printed wiring board obtained by the build-up method, it is possible to form a resist film in which the occurrence of cracks is suppressed, the film reduction of an unexposed area is suppressed, sensitivity and resolution are excellent, and the plating resistance is superior.

According to the method for forming a pattern of the present invention, in the process of circuit formation in the COF and the multilayer printed wiring board obtained by the build-up method, it is possible to form a fine pattern with high accuracy and fewer defects.

DETAILED DESCRIPTION OF THE INVENTION

In the present specification, the term "(meth)acrylic acid" means acrylic acid or methacrylic acid, and the term "(meth)acryloyl" means acryloyl or methacryloyl.

In addition, in the present specification, the term "monomer" means a polymerizable compound having a carbon-carbon double bond.

<Photosensitive Resin Composition>

The photosensitive resin composition of the present invention includes a vinyl-based polymer (I), a vinyl-based polymer (II), a quinonediazide compound (II), a specific compound (IV), and the other components as necessary.

(Vinyl-Based Polymer (I))

A vinyl-based polymer (I) can be obtained by polymerizing a monomer mixture containing a monomer (a) having a phenolic hydroxyl group, if necessary, further containing a carboxyl group-containing vinyl monomer (b) and an other vinyl-based monomer (c) which can polymerize with them.

A monomer (a) having a phenolic hydroxyl group (thereafter, also simply referred to as monomer (a)) is a monomer having one or more aromatic rings, in which one or more hydrogen atoms of the aromatic ring are replaced by hydroxyl groups.

As a monomer (a), a monomer (a1) represented by following formula (1), a monomer (a2) represented by following formula (2), and a monomer (a3) represented by the following formula (3) are preferable.

[Chemical Formula 3]

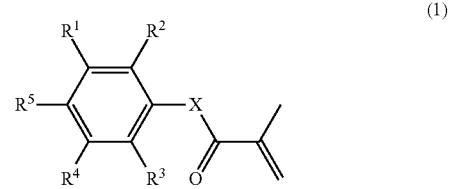

(1)

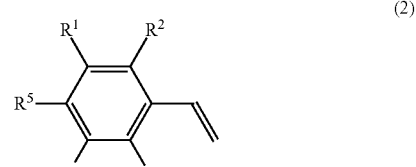

(2)

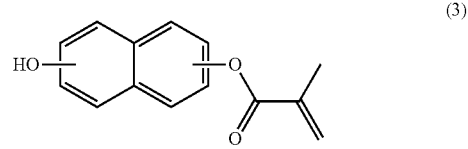

(3)

$R^1$ to $R^5$ are each independently a hydrogen atom, a hydroxyl group, an alkyl group of 1 to 24 carbon atoms, an aryl group of 1 to 24 carbon atoms, or an aralkyl group of 1 to 24 carbon atoms, provided that at least one of $R^1$ to $R^5$ is a hydroxyl group. As $R^1$ to $R^5$ except for a hydroxyl group and an hydrogen atom, an alkyl group of 1 to 24 carbon atoms are preferred, a hydrogen atom is more preferable for reasons of availability.

X is an oxygen atom or NH.

As a monomer (a1), a monomer (a1-1) represented by following formula (1-1), or a monomer (a1-2) represented by following formula (1-2) is preferable for reasons of availability.

In addition, as a monomer (a2), a monomer (a2-1) represented by the following formula (2-1) is preferable, for reasons of availability.

In addition, as a monomer (a3), a monomer (a3-1) represented by the following formula (3-1) is preferable, for reasons of availability.

[Chemical Formula 4]

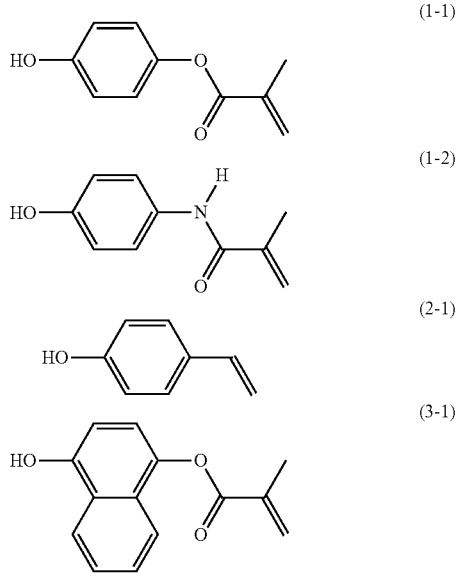

Examples of the carboxyl group-containing vinyl-based monomer (b) (hereafter, also simply referred to as monomer (b)) include (meth)acrylic acid, itaconic acid, itaconic acid monoester, fumaric acid, fumaric acid monoester, maleic acid, maleic acid monoester, 2-(meth)acryloyloxyethyl phthalic acid, 2-(meth)acryloyloxyethylhexahydrophthalic acid, and the like.

Examples of the other vinyl-based monomer (c) (hereafter, also simply referred to as monomer (c)) include (meth)acrylic acid esters which is not belong to monomers (a) and (b), acrylamide, methacrylamide, acrylonitrile, methacrylonitrile, styrenes (such as styrene, methylstyrene, chlorostyrene, and the like), and the like.

Examples of (meth)acrylic acid esters include methyl (meth)acrylate, ethyl(meth)acrylate, n-propyl(meth)acrylate, i-propyl(meth)acrylate, n-butyl(meth)acrylic acid, sec-butyl (meth)acrylate, tert-butyl(meth)acrylate, 2-ethylhexyl(meth) acrylate, phenyl(meth)acrylate, isobornyl(meth)acrylate, hydroxymethyl(meth)acrylate, hydroxyethyl(meth)acrylate, hydroxypropyl(meth)acrylate, and the like.

A vinyl-based polymer (I) can be prepared by known polymerization methods such as solution polymerization method, suspension polymerization method, emulsion polymerization method or the like. As a polymerization method, from the point of less impurities such as emulsifying agents, a solution polymerization method and a suspension polymerization method are preferred.

For example, a vinyl-based polymer can be obtained due to a known radical polymerization such as solution polymerization method, in which in the presence of an organic solvent heated to about 60 to 120° C. in the polymerization vessel, a monomer mixture in which monomers and a radical polymerization initiator such as azobisisobutyronitrile (AIBN) are dissolved is added dropwise over several hours, then polymerization is conducted. A monomer (a), a monomer (b), and a monomer (c) may be mixed and then supplied to the polymerization vessel in order to polymerization, or may be respectively separately supplied to the polymerization vessel, or mixture of any two monomers and the other one monomer may be separately supplied to the polymerization vessel.

The weight average molecular weight (Mw) (polystyrene equivalent value as measured by gel permeation chromatography) of the vinyl-based polymer (I) is not particularly limited, and is preferably from 5,000 to 80,000, more preferably from 6,000 to 30,000, and most preferably 7,000 to 15,000. If the weight average molecular weight is less than or equal to the upper limit of this range, the compatibility with other formulations such as a photosensitive agent can be maintained. If the weight average molecular weight is more than or equal to the lower limit of this range, the durability of the coating film can be maintained.

The amount of the monomer (a) is preferably 5 to 100 mol %, more preferably 10 to 95 mol %, further preferably 20 to 90 mol %, and especially preferably 30 to 60 mol %, relative to the total amount of crude monomers (a) to (c) as high as 100 mol %. If the amount of the monomer (a) is more than or equal to 5%, the resolution of the resist film can be sufficiently increased, and the film reduction of the unexposed area of the resist film can be sufficiently suppressed. From the point to improve the resolution, less than or equal to 90 mol % is preferred.

A monomer (c) is used for the purpose of improving the resolution.

A amount of the monomer (b) in the monomer mixture containing the monomer (a) and monomer (b) is preferably 0 to 30 mol %, relative to the total amount of monomers (a) to (c) as high as 100 mol %, more preferably 5 to 30 mol %, and further preferably 10 to 30 mol %. If the amount of the monomer (b) is more than or equal to 5 mol %, the resolution of the resist film can be sufficiently increased. If the amount of the monomer (b) is less than or equal to 30 mol %, the film reduction of the unexposed area of the resist film can be sufficiently suppressed, and the occurrence of cracks on the resist film can be sufficiently suppressed.

A monomer (c) is used as necessary for following purposes.

(i) to improve the polymerization between the monomer (a) and monomer (b);

(ii) to suppress the occurrence of clacks, when only a combination of a monomer (a) and a monomer (b) cannot obtain a sufficient performance, such as flexibility needed for a dry film.

The amount of the monomer (c) in the monomer mixture containing the monomer (a), monomer (b) and the monomer (c) is preferably 0 to 80 mol %, relative to the total amount of crude monomers (a) to (c) as high as 100 mol %.

(Vinyl-Based Polymer (II))

A vinyl-based polymer (II) can be obtained by polymerizing a monomer mixture containing a carboxyl group-containing vinyl monomer (b) and if necessary further containing another vinyl-based monomer (c) which can polymerize with the monomer (b). However, the monomer mixture does not contain the monomer (a) having a phenolic hydroxyl group.

As the monomer (b) and monomer (c), the same monomers as those illustrated in the above-mentioned vinyl polymer (I) can be mentioned.

The amount of the monomer (b) in the monomer mixture containing the monomer (b) is preferably 5 to 50 mol %, more preferably 5 to 30 mol %, and even more preferably 5 to 20 mol %, relative to 100 mol % of the total amount of the monomer (b) and monomer (c). If the amount of the monomer (b) is more than or equal to 5 mol %, the resolution of the resist film can be sufficiently increased. If the amount of the monomer (b) is less than or equal to 50 mol %, the film reduction of the unexposed area of the resist film can be sufficiently suppressed, and the occurrence of cracks on the resist film can be sufficiently suppressed.

The monomer (c) in the monomer mixture containing the monomer (a) and monomer (b) may be used to suppress the occurrence of cracks when a sufficient performance such as flexibility needed for a dry film cannot be obtained.

An amount of the monomer (c) is preferably 50 to 95 mol %, more preferably 70 to 95 mol %, and more preferably 80 to 95 mol %, relative to the total amount of the monomer (b) and the monomer (c) as high as 100 mol %.

The weight average molecular weight of the vinyl-based polymer (II) is 20,000 to 100,00, and preferably 20,000 to 80,000. If the weight average molecular weight of the vinyl-based polymer (II) is more than or equal to 20,000, etching resistance of the resist film and plating resistance is sufficiently high. If the weight average molecular weight of the vinyl-based polymer (II) is less than or equal to 100,000, the compatibility with other components of the resist solution becomes excellent.

The term, "a weight average molecular weight of a vinyl-based polymer (II)" is the polystyrene equivalent weight average molecular weight measured by gel permeation chromatography (GPC) under the following conditions.
(Measurement Condition of Weight Average Molecular Weight)
   measuring device: manufactured by Tosoh Corporation
   Separation column: three of Shodex GPC K-805L (trade name) manufactured by Showa Denko KK arranged in series
   Solvent: Tetrahydrofuran (flow rate: 1.0 mL/minutes)
   Detector: differential refractometer
   Standard polymers: Polystyrene
   Measurement temperature: 40° C.
   Injection volume: 0.1 mL In 100% by mass of the total amount of the vinyl-based polymer (I) and vinyl-based polymer (II), the content ratio of the vinyl-based polymer (I) and vinyl-based polymer (II) is preferably 20/80 to 95/5, and more preferably 50/50 to 90/10. If the amount of the vinyl-based polymer (I) is more than or equal to 20% by mass and the amount of the vinyl-based polymer is less than or equal to 80% by mass, the sensitivity and resolution of the resist film is not decreased, and the film reduction at unexposed are of resist film is sufficiently suppressed. If the amount of the vinyl-based polymer (I) is less than or equal to 95% by mass and the amount of the vinyl-based polymer (II) is more than or equal to 5% by mass, the plating resistance becomes sufficiently high, and the occurrence of cracks can be sufficiently suppressed.
(Quinonediazide Compound (III))

Examples of quinonediazide compound (III) include known 1,2-quinonediazide-4-sulfonic acid ester compound, 1,2-quinonediazide-5-sulfonic acid ester compound, 1,2-quinonediazide-6-sulfonic acid ester compound, 1,2-quinonediazide-7-sulfonic acid ester compound, and 1,2-quinonediazide-8-sulfonic acid ester compound. In particular, ester compounds derived from 1,2-naphtoquinonediazide sulfonic acid and trihydroxybenzophenones, ester compounds derived from 1,2-naphtoquinonediazide sulfonic acid and tetrahydroxybenzophenones, ester compounds derived from 1,2-naphtoquinonediazide sulfonic acid and pentahydroxybenzophenones, ester compounds derived from 1,2-naphtoquinonediazide sulfonic acid and hexahydroxybenzophenones, and ester compounds derived from 1,2-naphtoquinonediazide sulfonic acid and (polyhydroxy)alkanes.

As the quinonediazide compound (III), an ester compound derived from an aromatic polyhydroxy compound having 1 to 3 aromatic ring and at least one compound selected from the group consisting of 1,2-naphtoquinonediazide-5-sulfonic acid and 1,2-naphthoquinonediazide-4-sulfonic acid is preferable. In particular, an ester compound derived from at least one compound selected from the group consisting of a compound represented by the following formula (4-1), a compound represented by the following formula (4-2), a compound represented by the following formula (4-3) and at least one compound selected from the group consisting of 1,2-naphthoquinonediazide-5-sulfonic acid and 1,2-naphthoquinonediazide-4-sulfonic acid is especially preferable.

[Chemical Formula 5]

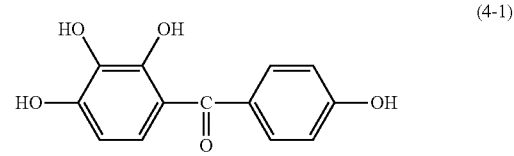

(4-1)

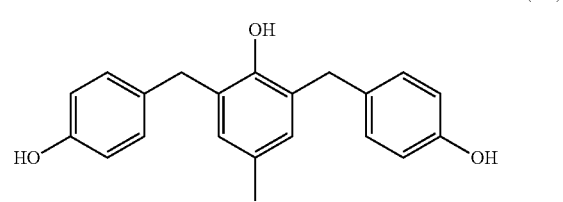

(4-2)

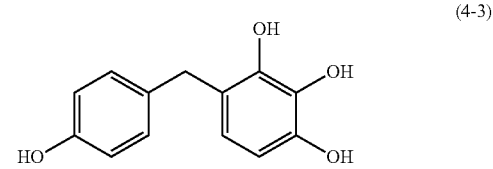

(4-3)

The content ratio of the quinonediazide compound (II) is preferably 5 to 70 parts by mass, more preferably 5 to 60 parts by mass, and further preferably 5 to 15 parts by mass, respect to the total amount of the vinyl-based polymer (I) and vinyl-based polymer (II) as high as 100 parts by mass. If the content ratio of the quinonediazide compound (II) is more than or equal to 5 parts by mass, the film reduction of the unexposed area of the resist film can be sufficiently suppressed, and the occurrence of cracks on the resist film can be sufficiently suppressed. If the content ratio of the quinonediazide compound (II) is less than or equal to 70 parts by mass, the resolution of the resist film can be sufficiently increased.
(Compound (IV)

The compound (IV) is a compound represented by the following formula (5), and a component for improving the alkali dissolution rate of the resist film, and thereby improving the resolution of the resist film.

[Chemical Formula 6]

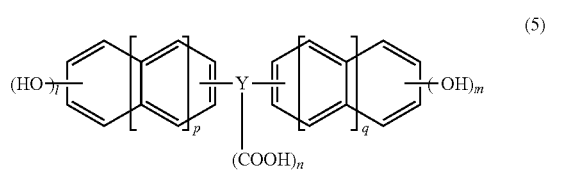

(5)

Y is a hydrocarbon group of 1 to 6 carbon atoms. From the point of the resolution of the resist film, an alkanetriyl group of 1 to 3 carbon atoms is preferred.

l and m are each independently an integer of 1 to 3. From the point of the resolution of the resist film, 1 or 2 is preferred.

n is 1 or 2. From the point of the resolution of the resist film, 1 is preferred.

p and q are respectively independently 0 or 1. From the point of the resolution of the resist film, 0 is preferred.

The compound (IV), for example, can be prepared in following method.

Vilsmeier reaction is conducted between the compound represented by the following formula (5-a) (In the formula, l and p have the same meaning as above) and phosphorus oxychloride in amides (for example, N,N-dimethylformamide, and the like). Next, after the resulting reaction mixture is reacted to sodium cyanide, the reaction mixture is hydrolyzed in the presence of acid or alkali, then the compound represented by following formula (5-b) (in the formula, l, n, p and Y have the same meaning as above) can be obtained. Next, a compound (IV) can be provided by condensation between the resulting compound and a compound represented by following formula (5-c) (in the formula, m and q have the same meaning as above) in the presence of an acid catalyst (such as hydrochloric acid).

[Chemical Formula 7]

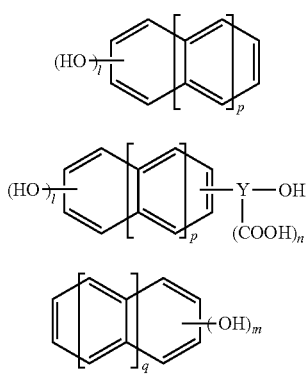

(5-a)

(5-b)

(5-c)

As the compound (IV), a compound represented by the following formula (5-1) or (5-2) is especially preferable, from the point of the resolution of the resist film.

[Chemical Formula 8]

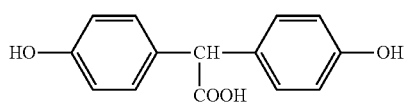

(5-1)

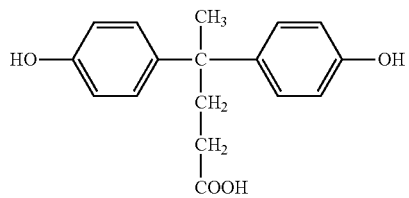

(5-2)

The content ratio of compound (IV) is preferably 0.5 to 10 parts by mass, more preferably 1 to 5 parts by mass, and even more preferable 2 to 4 parts by mass, relative to 100 parts by mass of the vinyl-based polymer (I). If the content ratio of compound (IV) is more than or equal to 0.5 parts by mass, the alkali dissolution rate of the resist film becomes sufficiently high. If the content ratio of compound (IV) is less than or equal to 10 parts by mass, the film reduction of the unexposed area of the resist film can be sufficiently suppressed.

(Other Components)

Examples of the other components include an alkali-soluble resin that does not belong to the vinyl-based polymer (I) or the vinyl-based polymer (II), a leveling agents, a storage stabilizer, a plasticizer, an absorption agents, a crosslinking agents, an adhesion auxiliary agent, and the like.

Examples of the alkali-soluble resin include a poly(meth)acrylic acid, a copolymer of (meth)acrylic acid and (meth)acrylate, a novolac resin, and the like.

The content ratio of other components is preferably 0 to 30% by mass, relative to 100% by mass of the solid content of the photosensitive resin composition.

(Dry Film)

The photosensitive resin composition of the present invention is usually used after forming a dry film.

The dry film, for example, is produced by applying a aftermentioned resist solution on the surface of the support film, and drying them to form a resist film, and laminating a protective film on top of the resist film.

The thickness of the resist film is preferably 3 μm or more, from the point of the usefulness as a dry film.

Examples of the material of the supporting film include polyethylene terephthalate (hereinafter, referred to as PET), aromatic polyamide, polyimide, polymethyl pentene, polyethylene, polypropylene and the like. From the point of view of cost and characteristics of the dry film, PET is preferred.

As the material of the protective film, polyethylene and polypropylene are preferred.

(Resist Solution)

The photosensitive resin composition of the present invention may be used in a condition of a resist solution dissolved in a solvent. The resist solution can be provided by a method of mixing a vinyl-based polymer (I), a quinonediazide compound (II), a specific compound (III), and a solvent; a method of adding a quinonediazide compound (III) and a specific compound (IV) to a solution containing a vinyl-based copolymer (I) and a vinyl-based copolymer (II) obtained by the solution polymerization method or suspension polymerization method.

As the solvent, for example, the following compounds may be mentioned.

As ketones, examples include linear or branched ketones such as acetone, methyl ethyl ketone (hereinafter, referred to as MEK), methyl isobutyl ketone, 2-pentanone, 2-hexanone; cyclic ketones such as cyclopentanone, cyclohexanone, and the like.

As propylene glycol monoalkyl acetates, examples include propylene glycol monomethyl ether acetate (hereinafter, referred to as PGMEA), propylene glycol monomethyl ether acetate, and the like.

As ethylene glycol monoalkyl ether acetates, examples include ethylene glycol monomethyl ether acetate, ethylene glycol monoethyl ether acetate, and the like.

As propylene glycol monoalkylethers, examples include propylene glycol monomethyl ether, propylene glycol monoethyl ether, and the like.

As ethylene glycol monoalkyl ethers, examples include ethylene glycol monomethyl ether, ethylene glycol monoethyl ether, and the like.

As diethylene glycol alkylethers, examples include diethylene glycol dimethylether, diethylene glycol monomethylether, and the like.

As esters, examples include ethyl acetate, ethyl lactate, and the like.

As alcohols, examples include methyl alcohol, ethyl alcohol, n-propyl alcohol, isopropyl alcohol, n-butyl alcohol, cyclohexanol, 1-octanol, and the like.

As other solvents, examples include 1,4-dioxane, ethylene carbonate, γ-butyrolactone, and the like.

As aliphatic hydrocarbon solvents of 5 to 11 carbon atoms, examples include pentane, 2-methylbutane, n-hexane, 2-methylpentane, 2,2-dibutylbutane, 2,3-dibutylbutane, n-heptane, n-octane, isooctane, 2,2,3-trimethylpentane, n-nonane, 2,2,5-trimethylhexane, n-decane, n-dodecane, and the like.

As a solvent, a single type of solvent may be used alone or two or more types of solvents may be used in combination.

As the solvent, from the point of safety and versatile usage, acetone, methyl alcohol, ethyl alcohol, isopropyl alcohol, MEK, PGMEA, ethyl lactate, cyclohexanone, and γ-butyrolactone are preferable. When a photosensitive resin composition is used after forming a dry film, acetone, MEK, methyl alcohol, ethyl alcohol, and isopropyl alcohol are preferred, since boiling point of these solvents is not so high.

The solid concentration of the resist solution is preferably less than or equal to 50% by mass, more preferably less than or equal to 40% by mass, and especially preferably less than or equal to 35% by mass, from the viewpoint of the viscosity of the resist solution. The solid concentration of the resist solution is preferably more than or equal to 2% by mass, more preferably more than or equal to 5% by mass, and especially preferably more than or equal to 8% by mass, from the point of the productivity of the vinyl-based polymer (I) and vinyl-based polymer (II).

The photosensitive resin composition of the present invention described above, because it contains the vinyl-based polymer (I) and vinyl-based polymer (II) instead of the conventional novolac resin, it is possible to form a resist film in which cracks are less likely to occur. In addition, since the vinyl-based polymer (I) has a structural unit derived from a monomer (a) having a phenolic hydroxyl group and the vinyl-based polymer (II) has a structural unit derived from a carboxyl group-containing vinyl-based monomer (b), in the resist film containing both of polymers, the film reduction of unexposed area is less likely to occur, and sensitivity and resolution thereof become excellent. In addition, the vinyl-based polymer (II) has a relatively high molecular weight, etching resistance of the resist film and plating resistance become excellent. In addition, because it contains a specific compound (IV), the resolution of the resist film can be further improved.

<Method for Forming a Pattern>

The method for forming a pattern of the present invention is a method including the following steps:

(A) forming a resist film composed of a photosensitive resin composition on the surface of the substrate;

(B) conducting exposing of the resist film to form a latent image;

(C) developing of the resist film in which a latent image is formed, using a developing solution having a pH of 10.5 to 12.5 to form a resist pattern; and (D) processing the part where the resist is not present and forming an intended resist pattern on the surface of the substrate.

(Step (A))

When using a resist solution described above, the resist solution is applied onto the surface of the substrate using a spinner or a coater, and dried, and then a resist film is formed on the surface of the substrate.

In the case of using aforementioned dry film, the dry film is laminated on the surface of the substrate so that the substrate on which a resist pattern will be formed can contact with the resist film.

(Step (B))

As a method of exposure, examples include ultraviolet exposure method, visible light exposure method, and the like.

As a method for selective exposure, examples include a method using a photomask, scanning exposure method using a laser beam, and the like. As a method of exposure in the case of using a photo-mask, both a contact exposure method and an off contact exposure method can be used.

In the case of using aforementioned dry film, after exposure of the resist film through the supporting film to form a latent image, the support film is peeled.

(Step (C))

As a developing solution, the aqueous solution of alkali, and the like can be mentioned.

As alkalies, the inorganic alkalies (sodium hydroxide, potassium hydroxide, sodium carbonate, sodium silicate, sodium metasilicate, ammonia water, and the like), primary amines (ethylamine, n-propylamine, and the like), secondary amines (diethylamine, di-n-butylamine, and the like), tertiary amines (triethylamine, methyldiethylamine, and the like), alcohol amines (dimethylethanolamine, triethanolamine, and the like), quaternary ammonium salts (tetramethylammonium hydroxide, tetraethylammonium hydroxide, choline hydroxide, and the like), and cyclic amines (pyrrole, piperidine, and the like).

In an aqueous solution of alkali, an appropriate amount of alcohols, surfactants, hydroxyl group-containing aromatic compounds, and the like may be added.

The pH of the developing solution is 10.5 to 12.5, and 11.0 to 12.0 is preferred. If the pH is 10.5 or more, the resolution of the resist film becomes sufficiently high. If the pH is 12.5 or less, the film reduction at unexposed are of resist film is sufficiently suppressed.

If 1% by mass of sodium carbonate aqueous solution (the pH is approximately 11.6) is used, it is especially preferred, because the same process as the process of circuit formation in general printed wiring boards can be used.

(Step (D))

As the processing method, known etching, plating, and the like can be mentioned.

EXAMPLES

Hereinafter, the present invention is specifically described by examples.

The evaluation methods in the experiments are as follows.

(Weight Average Molecular Weight)

Using GPC manufactured by Tosoh Corporation, the weight average molecular weight (Mw) of the vinyl-based polymer was measured. The measurement was conducted using three columns of Shodex GPC K-805L manufactured by Showa Denko KK arranged in-line as a separation column, using tetrahydrofuran as a solvent (flow rate: 1.0 mL/minute), using a differential refractometer as a detector, and using polystyrene as standard polymer, and under 40° C. of measurement temperature, with 0.1 mL of injection volume.

(Surface Condition)

The dry film was folded along the outer circumference of the cylinder having 10 cm diameter, the occurrence of cracks was visually observed and evaluated according to the following criteria.

A: no cracks occurred.

B: cracks occurred.

(Film Reduction of Unexposed Area)

The dry film was not exposed and then the film reduction after immersion in 1% by mass of aqueous solution of sodium carbonate (the pH is approximately 11.6) for 1 minute was measured, and evaluated according to the following criteria.

A: Film reduction was less than 10% by mass.

B: Film reduction was less than 20% by mass and 10% by mass or more.

C: Film reduction was less than 30% by mass and 20% by mass or more.

D: Film reduction was 30% by mass or more.

(Sensitivity)

The resist film was exposed with an ultra-high pressure mercury lamp to form a line and space patterns of 10 μm, and the sensitivity was evaluated according to the following criteria when development was conducted for 2 minutes by using 1% by mass of aqueous solution of sodium carbonate (the pH was approximately 11.6).

A: The sensitivity was under 100 mJ/cm$^2$.

B: The sensitivity was 100 to 200 mJ/cm$^2$.

C: The sensitivity was over 200 mJ/cm$^2$.

(Resolution)

The resist film was exposed with an ultra-high pressure mercury lamp to form a line and space patterns of 10 μm, and development was conducted for 2 minutes by using 1% by mass of aqueous solution of sodium carbonate (the pH was approximately 11.6). Then, the pattern shape was observed using an electron microscope and evaluated according to the following criteria.

A: Exposed area had been completely dissolved.

B: Some residues were remained on the edge of the pattern.

C: Some residues were remained on the exposed area.

D: Many residues were remained on the exposed area (Plating Resistance)

The resist film was exposed with an ultra-high pressure mercury lamp to form a line and space patterns of 10 μm, development was conducted for 2 minutes using 1% by mass of aqueous solution of sodium carbonate (the pH was approximately 11.6), and then a resist pattern was obtained. Then, after copper plating was conducted onto the pattern, the pattern shape was observed using an electron microscope and evaluated according to the following criteria.

A: There was no change in the resist properties before and after plating.

B: Cracks, bulge, defect and roughness of the surface occurred in the resist pattern.

Production Example 1

To a flask equipped with a nitrogen inlet, a stirrer, a condenser, a dropping funnel, and a thermometer, 40 parts by mass of MEK were added under a nitrogen atmosphere. The internal temperature was raised to 80° C. while stirring inside of the flask.

Then, the following mixture (hereinafter, referred to as dropping solution) was added dropwise into the flask from a dropping funnel over a period of 6 hours, and further held the temperature of 80° C. for 1 hour.

The dropping solution including:

40 mol % of monomer (a2-1) (para-hydroxystyrene) represented by the aforementioned formula (2-1);

15 mol % of methacrylic acid (monomer (b));

20 mol % of methyl methacrylate (monomer (c));

10 mol % of styrene (monomer (c));

15 mol % of ethyl acrylate (monomer (c));

7 parts by mass of a polymerization initiator (manufactured by Otsuka Chemical, 2,2'-azobis 2-methyl butyronitrile), relative to the total amount of the aforementioned monomers as high as 100 parts by mass; and 100 parts by mass of MEK.

Then, a dropping solution containing 10 parts by mass of MEK and 1 parts by mass of 2,2'-azobis 2-methylbutyronitrile was dropwise to the solution in the flask over 60 minutes. In addition, the solution in the flask was held for 3 hours at 80° C., then a solution of vinyl-based polymer (I-1) was obtained.

Production Examples 2 and 3

Each solution of the vinyl-based polymer (I-2) and (I-3) was obtained in the same manner of Synthesis Example 1, except that the amounts of each monomer were changed as shown in Table 1.

Production Example 4

To a flask equipped with a nitrogen inlet, a stirrer, a condenser, a dropping funnel, and a thermometer, 50 parts by mass of MEK were added under a nitrogen atmosphere. The internal temperature was raised to 80° C. while stirring inside of the flask.

Then, the following mixture (hereinafter, referred to as dropping solution) was added dropwise into the flask from a dropping funnel over a period of 4 hours, and held at a temperature of 80° C. for 1 hour.

The dropping solution including:

20 mol % of methacrylic acid (monomer (b));

46 mol % of methyl methacrylate (monomer (c));

15 mol % of styrene (monomer (c));

19 mol % of ethyl acrylate (monomer (c));

7 parts by mass of a polymerization initiator (manufactured by Otsuka Chemical, 2,2'-azobis 2-methyl butyronitrile), relative to the total of the aforementioned monomers as high as 100 parts by mass; and 30 parts by mass of MEK.

Then, a dropping solution containing 10 parts by mass of MEK and 1 parts by mass of 2,2'-azobis-2-methylbutyronitrile was dropwise to the solution in the flask over 60 minutes. In addition, the solution in the flask was held for 3 hours at 80° C., then the temperature was cooled to room temperature. Then, 60 parts by mass of MEK was added to the solution in the flask, and thereby a solution of a vinyl-based polymer (II-1) was obtained.

Production Examples 5 and 6

Each solution of vinyl-based polymer (II-2) and (II-3) was obtained in the same manner of Production Example 4, except that the amounts of each monomer were changed as shown in Table 1.

Production Example 7

The solution of vinyl-based polymer (II-4) was obtained in the same manner of Production Example 4, except that the amounts of MEK to add to flask was changed to 45 parts by mass, the amounts of the polymerization initiator was changed to 0.25 parts by mass relative to the total amount of monomers as high as 100 parts by mass, and the amount of MEK added after reducing the temperature to room temperature was changed to 70 parts by mass.

Production Example 8

The solution of the vinyl-based polymer (II-5) was obtained in the same manner of Production Example 4, except that the amounts of the polymerization initiator was changed to 3 parts by mass relative to the total amount of monomers as high as 100 parts by mass.

Production Example 9

The solution of the vinyl-based polymer (II-6) was obtained in the same manner of Production Example 4, except that the amounts of MEK added to flask was changed to 40 parts by mass, the amounts of the polymerization initiator was changed to 0.2 parts by mass relative to the total amount of monomers as high as 100 parts by mass, and the amount of MEK to add after reducing the temperature to room temperature was changed to 70 parts by mass.

TABLE 1

| Vinyl-based copolymer | monomer (mol %) | | | | | | Weight average molecular weight Mw |
|---|---|---|---|---|---|---|---|
| | (a) | | (b) | (c) | | | |
| | monomer (a1-1) | monomer (a2-1) | MAA | MMA | St | EA | |
| (I-1) | — | 40 | 15 | 20 | 10 | 15 | 8,500 |
| (I-2) | — | 100 | — | — | — | — | 7,000 |
| (I-3) | 40 | — | 15 | 20 | 10 | 15 | 9,000 |
| (II-1) | — | — | 20 | 46 | 15 | 19 | 33,000 |
| (II-2) | — | — | 10 | 56 | 15 | 19 | 32,000 |
| (II-3) | — | — | 30 | 36 | 15 | 19 | 35,000 |
| (II-4) | — | — | 20 | 46 | 15 | 19 | 98,000 |
| (II-5) | — | — | 20 | 46 | 15 | 19 | 16,000 |
| (II-6) | — | — | 20 | 46 | 15 | 19 | 150,000 |

In the table, the monomer (a1-1) is the monomer represented by the formula (1-1) (manufactured by Osaka Organic Chemical Industry Ltd.), the monomer (a2-1) is the monomer represented by the formula (2-1) (that is, para-hydroxystyrene), MAA is methacrylic acid, MMA is methyl methacrylate, St is styrene, and EA is ethyl acrylate.

[Synthesis Example of Compound (IV)]
(Synthesis of Compound Represented by Formula (5-1))

A mixture of 16.8 parts by mass of 4-hydroxy mandelic acid, 37.6 parts by mass of phenol, and 170 parts by mass of 10% HCl was reacted for 2 hours at a temperature of 60 to 65° C. After the reaction was completed, a mixture of 300 parts by mass of ion-exchanged water and 300 parts by mass of acetone was added thereto and separated into a water layer and an organic layer at 60° C. Obtained organic layer was washed with ion-exchanged water. The washed organic layer was concentrated under reduced pressure, then the resulting residue was recrystallized from a mixture solvent of 5 parts by mass of acetone and 80 parts by mass of toluene, then the compound (IV) represented by the formula (5-1) was obtained. From $^1$H-NMR and IR, it was confirmed that the desired compound had been obtained.

(Synthesis of Compound Represented by Formula (5-2))

A mixture of 94 parts by mass of phenol, 58 parts by mass of levulinic acid, 45 parts by mass of water and 180 parts by mass of 10% HCl was reacted for 20 hours at 20° C. After the reaction was completed, a mixture of 300 parts by mass of ion-exchanged water and 300 parts by mass of ethyl acetate was added to the aforementioned mixture and separated into a water layer and an organic layer. Aqueous solution of sodium bicarbonate was added to the resulting organic layer, and the organic layer was extracted. The resulting extract of sodium bicarbonate aqueous solution was acidified, extracted with ether, and evaporated under vacuum conditions, then a specific compound (IV) represented by the formula (5-2) was obtained. From $^1$H-NMR and IR, it was confirmed that the desired compound had been obtained.

Example 1

75 parts by mass of the vinyl-based polymer solution (I-1), 25 parts by mass of the vinyl-based polymer solution (II-1), 10 parts by mass of the ester compound derived from a compound represented by formula (4-1) (1 mol) and 1,2-naphthoquinonediazide-5-sulfonic acid (3 mol) as a quinonediazide compound (III), 2 parts by mass of the compound represented by the formula (5-1) as a specific compound (IV), and 200 parts by mass of MEK was mixed, and thereby a resist solution was obtained.

On a copper laminated plate, the resist solution was applied using a wire bar so that the thickness after drying the resist solution became 5 and dried and thereby a resist film was formed. The resist film was evaluated. The results are shown in Table 3.

The resist solution was applied on the surface of PET film having a thickness of 15 μm so that the thickness of the resist film became 5 μm, and dried and thereby a dry film was obtained.

On a copper laminated plate, the dry film was laminated and thereby a resist film was formed. The dry film was evaluated. The results are shown in Table 3.

Examples 2 to 13

Comparative Examples 1 to 5

Each dry film was obtained in the same manner of Example 1, except that the type and amount of the vinyl-based polymer (I), the type and amount of the vinyl-based polymer (II), the type of the quinonediazide compound (III), and the type and amount of the specific compound (IV), and the amount of MEK were changed as shown in Table 2. The dry film was evaluated. The results are shown in Table 3.

Comparative Example 6

A dry film was obtained in the same manner of Example 1, expect that the vinyl-based polymer (I-1) and the vinyl-based polymer (II-1) were changed to a novolac resin. The results are shown in Table 3.

TABLE 2

|  | Vinyl-based polymer (I)// novolac resin | | Vinyl-based polymer (II) | | Component (III) | | Component (IV) | | MEK |
|---|---|---|---|---|---|---|---|---|---|
|  | type of polymer | parts by mass | type of polymer | parts by mass | type of polymer | parts by mass | type of polymer | parts by mass | parts by mass |
| Example 1 | (I-1) | 75 | (II-1) | 25 | (III-1) | 10 | (5-1) | 2 | 200 |
| Example 2 | (I-1) | 75 | (II-2) | 25 | (III-1) | 10 | (5-1) | 2 | 200 |
| Example 3 | (I-1) | 75 | (II-3) | 25 | (III-1) | 10 | (5-1) | 2 | 200 |
| Comparative Example 1 | (I-1) | 100 | — | — | (III-1) | 10 | (5-1) | 2 | 200 |
| Comparative Example 2 | (I-1) | 75 | (II-5) | 25 | (III-1) | 10 | (5-1) | 2 | 200 |
| Comparative Example 3 | (I-1) | 75 | (II-6) | 25 | (III-1) | 10 | (5-1) | 2 | 200 |
| Example 4 | (I-2) | 75 | (II-1) | 25 | (III-1) | 10 | (5-1) | 2 | 200 |
| Example 5 | (I-3) | 75 | (II-1) | 25 | (III-1) | 10 | (5-1) | 2 | 200 |
| Comparative Example 4 | — | — | (II-1) | 100 | (III-1) | 10 | (5-1) | 2 | 200 |
| Example 6 | (I-1) | 75 | (II-1) | 25 | (III-2) | 10 | (5-1) | 2 | 200 |
| Example 7 | (I-1) | 75 | (II-1) | 25 | (III-3) | 10 | (5-1) | 2 | 200 |
| Example 8 | (I-1) | 75 | (II-1) | 25 | (III-4) | 10 | (3-1) | 2 | 200 |
| Example 9 | (I-1) | 75 | (II-1) | 25 | (III-1) | 10 | (5-1) | 1 | 200 |
| Example 10 | (I-1) | 75 | (II-1) | 25 | (III-1) | 10 | (5-1) | 5 | 200 |
| Example 11 | (I-1) | 75 | (II-1) | 25 | (III-1) | 10 | (5-1) | 10 | 200 |
| Example 12 | (I-1) | 75 | (II-4) | 25 | (III-1) | 10 | (5-1) | 2 | 300 |
| Example 13 | (I-1) | 75 | (II-1) | 25 | (III-1) | 10 | (5-2) | 2 | 200 |
| Comparative Example 5 | (I-1) | 75 | (II-1) | 25 | (III-1) | 10 | (5-1) | — | 200 |
| Comparative Example 6 | novolac | 100 | — | — | (III-1) | 10 | (5-1) | 2 | 200 |

In the table, the compound (III-3) is an ester compound derived from a compound represented by the formula (4-1) (1 mol) and 1,2-naphtoquinonediazide-5-sulfonic acid (3 mol); the compound (III-2) is an ester compound derived from a compound represented by the formula (4-2) (1 mol) and 1,2-naphotoquinonediazide-5-sulfonic acid (2 mol); the compound (III-3) is an ester compound derived from the compound represented by the formula (4-3) (1 mol) and 1,2-naphtoquinonediadide-5-sulfonic acid (3 mol); and the compound (III-4) is an ester compound derived from the compound represented by the formula (4-4) (1 mol) and 1,2-naphtoquinonediazide-5-sulfonic acid (2 mol).

[Chemical Formula 9]

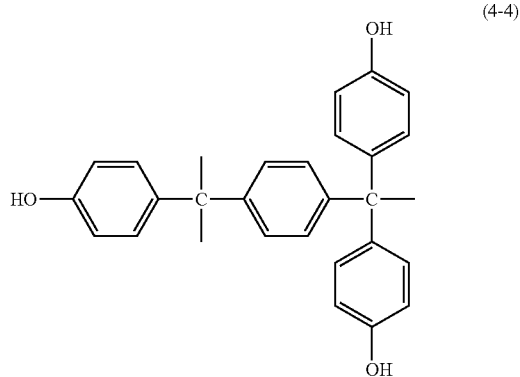

(4-4)

TABLE 3

|  | Condition of resist | Surface condition | Film reduction | Sensitivity | Resolution | Plating resistance |
|---|---|---|---|---|---|---|
| Example 1 | resist solution | — | A | A | A | A |
|  | DF | A | A | A | A | A |
| Example 2 | DF | A | A | A | B | A |
| Example 3 | DF | A | A | A | A | A |
| Comparative Example 1 | DF | A | A | A | A | B |
| Comparative Example 2 | DF | A | A | A | A | B |
| Comparative Example 3 | DF | — | — | — | — | — |
| Example 4 | DF | A | A | A | B | A |
| Example 5 | DF | A | A | A | A | A |
| Comparative Example 4 | DF | A | C | C | D | A |

TABLE 3-continued

| | Condition of resist | Surface condition | Film reduction | Sensitivity | Resolution | Plating resistance |
|---|---|---|---|---|---|---|
| Example 6 | DF | A | A | A | A | A |
| Example 7 | DF | A | A | A | A | A |
| Example 8 | DF | A | A | B | C | A |
| Example 9 | DF | A | A | A | B | A |
| Example 10 | DF | A | B | A | A | A |
| Example 11 | DF | A | C | A | A | A |
| Example 12 | DF | intermediate between A and B | A | A | B | A |
| Example 13 | DF | A | A | A | A | A |
| Comparative Example 5 | DF | A | A | B | D | A |
| Comparative Example 6 | DF | B | — | — | — | — |

In the table, the "resist solution" indicates that the resist film directly formed from the resist solution was evaluated, "DF" indicates that resist film formed through a dry film was evaluated.

From the result of the evaluation, in Comparative Example 1, because it did not contain the vinyl-based polymer (II), the plating resistance was insufficient.

In Comparative Example 2, because the weight average molecular weight of the vinyl-based polymer (II) was too low, the plating resistance was insufficient.

In Comparative Example 3, because the weight average molecular weight of the vinyl-based polymer (II) was too high, the compatibility of the resist solution was bad.

In Comparative Example 4, because it did not contain the vinyl-based polymer (I), the sensitivity and resolution were insufficient, and the film reduction was slightly declined.

In Example 8, because the ester compound which was derived from an aromatic polyhydroxy compound having four aromatic rings and 1,2-naphthoquinone diazide-5-sulfonic acid was used as a quinonediazide compound (III), the sensitivity and the resolution was slightly declined.

In Comparative Example 5, because it did not contain a specific compound (IV), the resolution was insufficient.

In Comparative Example 6, because it contains a novolac resin, cracks occurred.

INDUSTRIAL APPLICABILITY

The photosensitive resin composition of the present invention, it is useful as a resist in the case of manufacturing a chip-on-film (COF) and a multilayer printed wiring board obtained by the build-up method.

The invention claimed is:
1. A photosensitive resin composition comprising:
a vinyl-based polymer (I) obtained by polymerizing a monomer mixture containing a monomer (a) having a phenolic hydroxyl group;
a vinyl-based polymer (II) obtained by polymerizing a monomer mixture containing a carboxyl group-containing vinyl monomer (b), and having a weight average molecular weight of 20,000 to 100,000, provided that the vinyl-based polymer (I) is excluded;
a quinonediazide compound (III); and
a compound (IV) represented by following formula (5)

[Chemical Formula 1]

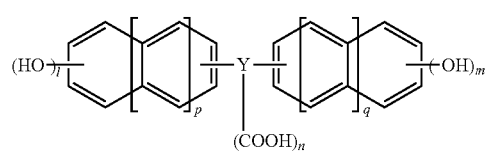

(5)

[In the formula, Y is a hydrocarbon group of 1 to 6 carbon atoms; l and m are each independently an integer of 1 to 3; n is 1 or 2; p and q are each independently 0 or 1].

2. The photosensitive resin composition according to claim 1, wherein the compound (IV) is at least one compound selected from a group consisting of compounds represented by formula (5-1) and (5-2)

[Chemical Formula 2]

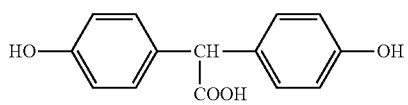

(5-1)

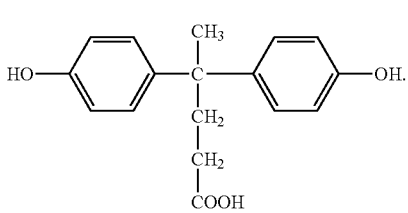

(5-2)

3. The photosensitive resin composition according to claim 1, wherein the vinyl-based polymer (I) is a polymer obtained by polymerizing the monomer mixture further containing a carboxyl group-containing vinyl monomer (b).

4. The photosensitive resin composition according to claim 1, wherein the vinyl-based copolymer (I) is a polymer obtained by polymerizing the monomer mixture containing the monomer (a), and the amount of the monomer (a) is 5 to 100 mol %, relative to the total amount of crude monomers as high as 100 mol %.

5. The photosensitive resin composition according to claim 3, wherein the vinyl-based polymer (I) is a polymer obtained by polymerizing the monomer mixture containing the monomer (a) and the monomer (b), and the amount of the monomer (b) is 5 to 30 mol %, relative to the total amount of crude monomers as high as 100 mol %.

6. The photosensitive resin composition according to claim 1, wherein the vinyl-based polymer (II) is a polymer obtained by polymerizing the monomer mixture containing the monomer (b), and the amount of the monomer (b) is 5 to 50 mol %, relative to the total amount of crude monomers as high as 100 mol %.

7. The photosensitive resin composition according to claim 1, wherein the quinonediazide (III) is an ester compound derived from a aromatic polyhydroxy compound having 1 to 3 aromatic rings and at least one compound selected from a group consisting of 1,2-naphthoquinonediazide-5-sulfonic acid and 1,2-naphthoquinonediazide-4-sulfonic acid.

8. The photosensitive resin composition according to the claim 7, wherein the quinonediazide compound (III) is an ester compound derived from at least one compound selected from a group consisting of a compound represented by the following formula (4-1), a compound represented by the following formula (4-2), and a compound represented by the following formula (4-3) and at least one compound selected from the group consisting of 1,2-naphthoquinonediazide-5-sulfonic acid and 1,2-naphthoquinonediazide-4-sulfonic acid

[Chemical Formula 3]

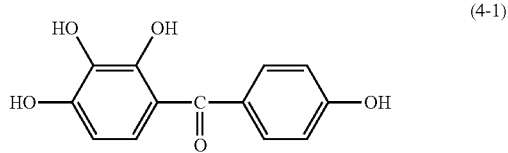
(4-1)

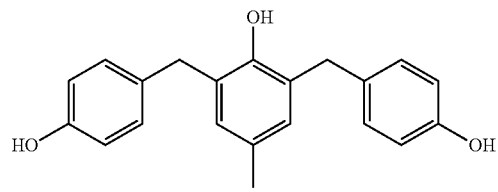
(4-2)

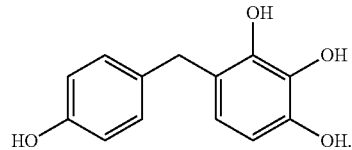
(4-3)

9. A photosensitive dry film composed from the photosensitive resin composition according to claim 1 on the surface of the support film.

10. A method for forming a pattern including:
forming a resist film composed of the photosensitive resin composition according to claim 1 on the surface of the substrate;
conducting exposure of the resist film to form a latent image;
developing the resist film in which the latent image is formed, using a developing solution having pH 10.5 to 12.5 to form a resist pattern.

* * * * *